(12) United States Patent
Gao

(10) Patent No.: US 12,178,020 B2
(45) Date of Patent: Dec. 24, 2024

(54) SIDE FLUID COOLING APPARATUS FOR SERVER RACKS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 302 days.

(21) Appl. No.: 17/731,708

(22) Filed: Apr. 28, 2022

(65) Prior Publication Data

US 2023/0354560 A1  Nov. 2, 2023

(51) Int. Cl.
*H05K 7/20* (2006.01)

(52) U.S. Cl.
CPC ..... *H05K 7/20818* (2013.01); *H05K 7/20318* (2013.01); *H05K 7/20327* (2013.01)

(58) Field of Classification Search
CPC ........... H05K 7/20818; H05K 7/20318; H05K 7/20327
See application file for complete search history.

(56) References Cited

U.S. PATENT DOCUMENTS

| | | | | |
|---|---|---|---|---|
| 10,225,958 B1 * | 3/2019 | Gao | ............... | H05K 7/20781 |
| 10,912,230 B1 * | 2/2021 | Gao | ............... | H05K 7/18 |
| 10,966,354 B1 * | 3/2021 | Shao | ............... | F28D 15/00 |
| 11,291,143 B2 * | 3/2022 | Gao | ............... | H05K 7/20754 |
| 11,683,913 B2 * | 6/2023 | Zhang | ............... | H05K 7/20772 |
| | | | | 361/679.53 |
| 11,765,865 B2 * | 9/2023 | Gao | ............... | H05K 7/20781 |
| | | | | 361/679.53 |
| 11,937,405 B2 * | 3/2024 | Chen | ............... | H05K 7/20663 |
| 2015/0131228 A1 * | 5/2015 | Ishikawa | ............... | H05K 7/20827 |
| | | | | 361/699 |
| 2016/0330873 A1 * | 11/2016 | Farshchian | ............... | G06F 1/20 |
| 2017/0049009 A1 * | 2/2017 | Steinke | ............... | H05K 7/20736 |
| 2017/0177041 A1 * | 6/2017 | Shelnutt | ............... | H05K 7/20809 |
| 2017/0181326 A1 * | 6/2017 | Shelnutt | ............... | H05K 7/20781 |
| 2018/0242478 A1 * | 8/2018 | Cui | ............... | H01R 3/08 |
| 2019/0150326 A1 * | 5/2019 | Gao | ............... | H05K 7/20745 |
| | | | | 361/679.47 |
| 2021/0084796 A1 * | 3/2021 | Gao | ............... | H05K 7/20818 |
| 2021/0092862 A1 * | 3/2021 | Gao | ............... | H05K 7/20745 |
| 2021/0092874 A1 * | 3/2021 | Gao | ............... | H05K 7/20181 |
| 2021/0100134 A1 * | 4/2021 | Gao | ............... | H05K 7/20781 |
| 2021/0104788 A1 * | 4/2021 | Shao | ............... | H01M 10/627 |
| 2022/0354026 A1 * | 11/2022 | Kelley | ............... | H05K 7/20818 |
| 2022/0361376 A1 * | 11/2022 | Gao | ............... | H05K 7/20818 |

\* cited by examiner

*Primary Examiner* — Nelson J Nieves
(74) *Attorney, Agent, or Firm* — WOMBLE BOND DICKINSON (US) LLP

(57) ABSTRACT

A cooling apparatus includes a unit frame having one or more slots therein, a cooling liquid supply line, a cooling liquid return line, and one or more fluid distribution modules insertable into the one or more slots. A fluid distribution module includes a pair of blind mating connectors that are fluidly connected to the cooling liquid supply and return lines when the fluid distribution module is inserted into a slot. A condenser is disposed at a top portion of the fluid distribution module. A vapor manifold is fluidly coupled to a return port of the condenser and the vapor manifold includes a plurality of return connections. A fluid manifold is fluidly coupled to a supply port of the condenser and the fluid manifold includes the plurality of supply connections. The supply and return connections are fluidly coupled to a plurality of servers populated on an electronic rack.

18 Claims, 9 Drawing Sheets

SIDE FLUID COOLING APPARATUS FOR SERVER RACKS

FIELD OF THE INVENTION

Embodiments of the present invention relate generally to data center and energy storage system cooling. More particularly, embodiments of the invention relate to a side fluid cooling apparatus for server racks.

BACKGROUND

Thermal management for a data center that includes several active electronic racks is critical to ensure proper performance of servers and/or other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit.

Recently, data centers have been deploying high-power density electronic racks, where a large quantity of high-density chips are packaged closer together to provide more computing power. Cooling these high-density racks by maintaining a proper thermal environment may be an issue with existing cooling systems, such as a computer room air conditioning (CRAC) unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks. Since heat removal capacity of fluid is much larger than heat removal capacity of air, thus it is more economical to move cooling fluid for cooling. Therefore, designing the cooling fluid closer to the IT, indirectly or directly in contact with electronics are an effective mean.

There has been much effort and work on development of more efficient and effective thermal management solutions for servers and data centers, such as hybrid cooling, liquid cooling. However, there continues to be challenges since the power density of electronics continues to increase. Liquid cooling may be a possible mean for high power density scenarios. Utilizing phase change coolant in liquid cooling may provide more opportunities to improve thermal performance for high power density scenarios.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
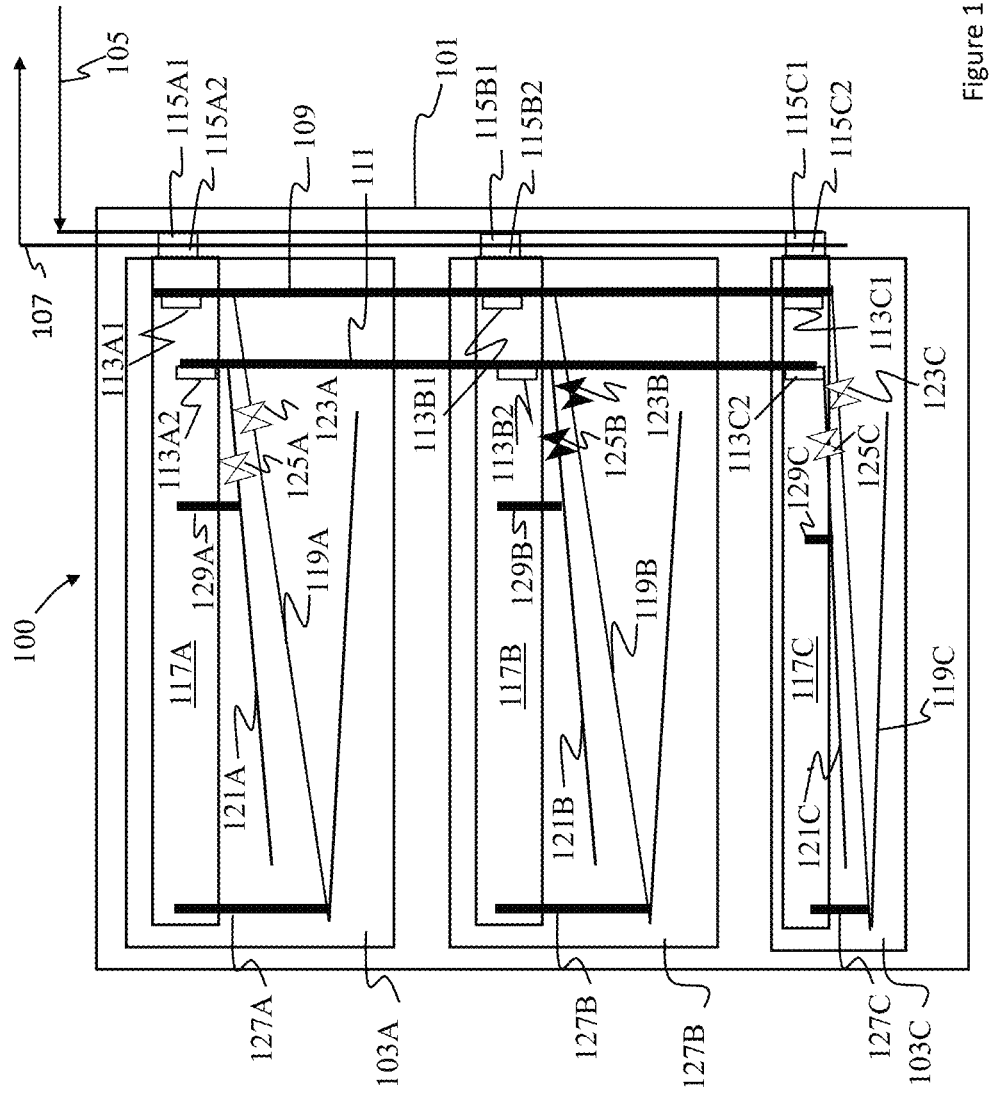
FIG. 1 is a block diagram illustrating a side view of a cooling apparatus according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment. Two-phase coolant fluid refers to a cooling fluid that has their temperature rise as they absorb heat. The two-phase coolant fluid further undergoes a phase change from liquid to vapor as they absorb heat and holding that thermal energy until the coolant fluid is again liquefied. Single-phase coolant fluid refers to a cooling fluid that has their temperature rise as they absorb heat but the fluid does not undergo a phase change.

Embodiments of the present disclosure relates to an intermediate cooling system that supports a liquid cooling loop and a two-phase fluid coolant loop between an electronic rack and the servers of the electronic rack. Existing solutions for liquid connectors connecting servers to electronic racks are typically implemented by manual mating connectors or blind mating connectors but the fluid connections are individually connected. Connecting individual connectors is time consuming at deployment time. Further, manual mating connections typically lack reliability and blind mating connections may involve a complex design.

The intermediary cooling system (cooling apparatus for short) can interface fluid connections of the servers to fluid connections of the electronic rack. The cooling apparatus allows connectors to be connected prior to deployment and minimizes a deployment time. The cooling apparatus is robust and can support either a unified or isolated coolant loops for two-phase and/or single-phase coolant fluids. The cooling apparatus enables a unified approach for fluid connections and increase interoperability of the servers and electronic racks.

According to a first aspect, a cooling apparatus includes a unit frame having one or more slots therein, a cooling liquid supply line, a cooling liquid return line to form a cooling liquid loop along a length of the unit frame with the cooling liquid supply line, and one or more fluid distribution modules insertable into the one or more slots. A fluid distribution module includes a pair of blind mating connectors that are fluidly connected to the cooling liquid supply and return lines when the fluid distribution module is inserted into a slot, a condenser at a top portion of the fluid distribution module, a vapor manifold fluidly coupled to a return port of the condenser and the vapor manifold includes a plurality of return connections along a length of the vapor manifold, and a fluid manifold fluidly coupled to a supply port of the condenser and the fluid manifold includes the plurality of supply connections along a length of the fluid manifold, where the plurality of supply and return connections are fluidly coupled to a plurality of servers of an electronic rack to provide a coolant fluid to the plurality of servers.

In one embodiment, the cooling apparatus further includes a number of connectors at the supply and return connections to interface with a number of supply and return connectors of a server chassis.

In one embodiment, the vapor manifold connects a return port of the condenser to the plurality of return connections at a first inclined angle to facilitate vapor return from the plurality of return connections to the condenser. In one embodiment, the fluid manifold connects a supply port of the condenser to the plurality of supply connections at a second inclined angle to facilitate liquid supply from the condenser to the plurality of supply connections.

In one embodiment, the cooling apparatus further includes a two-phase fluid supply line along the length of the container, where the two-phase fluid supply line is fluidly coupled to the fluid manifold of each fluid distribution module. In one embodiment, the cooling apparatus further includes one or more supply valves disposed in between the two-phase fluid supply line and the fluid manifold of each fluid distribution module, wherein the one or more supply valves open to allow fluid of a respective fluid distribution module to mix with that of other fluid distribution modules.

In one embodiment, the cooling apparatus further includes a two-phase fluid return line along the length of the container, wherein the two-phase fluid return line is fluidly coupled to the vapor manifold of each fluid distribution module. In one embodiment, the cooling apparatus further includes one or more return valves disposed in between the two-phase fluid return line and the vapor manifold of each fluid distribution module, wherein the one or more return valves open to allow vapor of a respective fluid distribution module to mix with that of other fluid distribution modules.

In one embodiment, the cooling apparatus further includes two-phase fluid supply and return lines that are fluidly coupled to the condenser of each fluid distribution module via blind-mating connectors. In one embodiment, when a supply and return valve corresponding to a fluid distribution module are close, the fluid of the fluid distribution module is isolated from other fluid distribution modules, wherein a first fluid distribution module contains two-phase coolant fluid and a second fluid distribution module contains single-phase coolant fluid.

According to a second aspect, a server rack includes a main frame having one or more server chassis, each containing a plurality of servers therein, and a cooling apparatus secured to the main frame. The cooling apparatus includes a unit frame having one or more slots therein, a cooling liquid supply line, a cooling liquid return line to form a cooling liquid loop along a length of the unit frame with the cooling liquid supply line, and one or more fluid distribution modules insertable into the one or more slots to correspond to the one or more server chassis. A fluid distribution module includes a pair of blind mating connectors that are fluidly connected to the cooling liquid supply and return lines when the fluid distribution module is inserted into a slot, a condenser at a top portion of the fluid distribution module, a vapor manifold fluidly coupled to a return port of the condenser and the vapor manifold includes a plurality of return connections along a length of the vapor manifold, and a fluid manifold fluidly coupled to a supply port of the condenser and the fluid manifold includes the plurality of supply connections along a length of the fluid manifold, where the plurality of supply and return connections are fluidly coupled to a plurality of servers of an electronic rack to provide a coolant fluid to the plurality of servers.

In one embodiment, the server chassis includes a detachable connection panel having the plurality of connectors disposed on the detachable connection panel, a chassis side module having at least a fluid supply channel and a fluid return channel, and a number of flexible hoses fluidly coupling the connectors disposed on the connection panel to either the supply or return channels of the chassis side module.

In one embodiment, the server chassis further includes a chassis rear module having at least a fluid supply channel and a fluid return channel, a pair of flexible hoses fluidly coupling the supply and return channels of the chassis side module to the supply and return channels of the chassis rear module. In one embodiment, the chassis rear module includes a number of blind-mating connectors that are fluidly coupled to corresponding blind-mating connectors of the servers.

FIG. 1 is a block diagram illustrating a side view of a cooling apparatus 100 according to one embodiment. Cooling apparatus 100 can improve deployment efficiency and interoperability of server racks using liquid cooling solutions. As shown, cooling apparatus 100 includes one or more fluid distribution modules 103A-C that can be integrated to an electronic rack. In one embodiment, cooling apparatus 100 includes a cooling liquid loop 105-107 at a rear side. The cooling liquid loop includes a supply liquid line 105 and a return liquid line 107. The cooling liquid loop can carry a cooling liquid (such as water) to any of condensing unit 117A-C of the one or more fluid distribution modules 103A-C, where the cooling liquid supplied by supply liquid line 105 can absorb thermal energy from the condensing units 117A-C and the cooling liquid carry thermal energy away from the condensing units 117A-117C and returns to a facility source via return liquid line 107.

Figure 6:
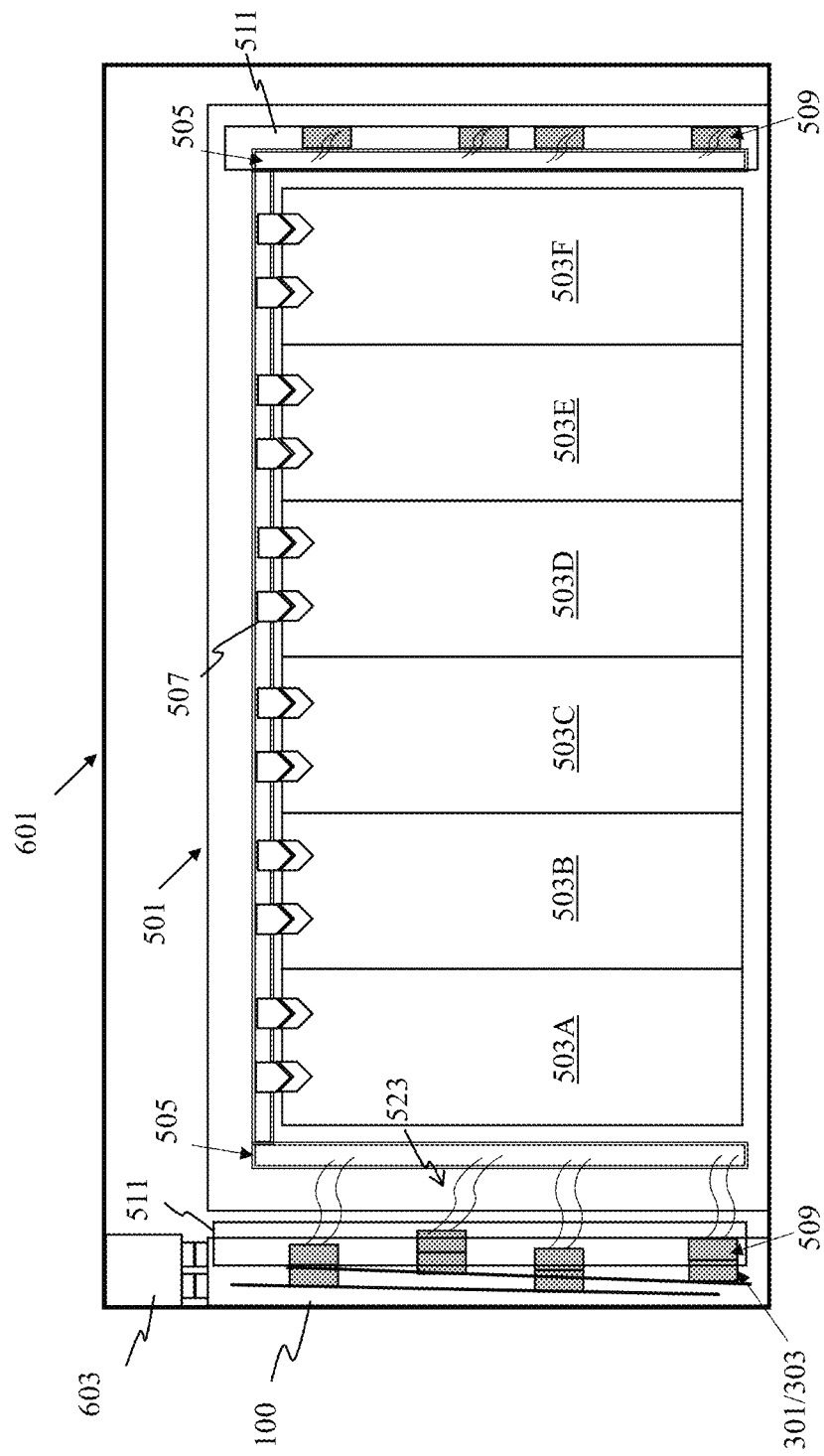
FIG. 6 is a block diagram illustrating a top view of a server chassis coupled to a cooling apparatus according to one embodiment.
Figure 7:
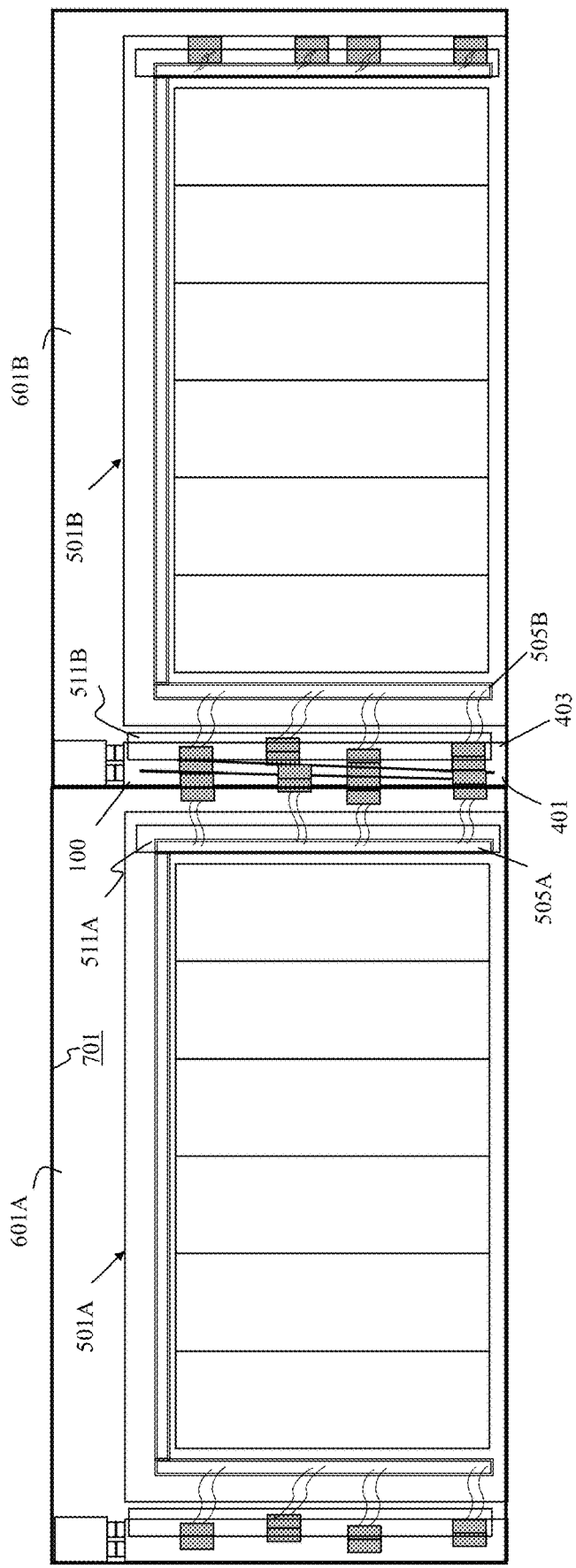
FIG. 7 is a block diagram illustrating a top view of two adjacent racks sharing a cooling apparatus according to one embodiment.

In one embodiment, cooling apparatus 100 can be integrated to a server rack as further shown in FIGS. 6-7. In one embodiment, cooling apparatus 100 includes a two phase coolant fluid loop to circulate two-phase coolant fluid (such as mineral oil, glycol, dielectric solution, etc.) among any of fluid distribution modules 103A-C. The two phase coolant fluid loop can include a vapor line 109 and a fluid line 111. Vapor line 109 and fluid line 111 can include respective fluid connectors 113A1-A2, 113B1-B2, and 113C1-C2 that are disposed at predetermined positions along vapor line 109 and fluid line 111 to interface with fluid distribution modules 103A-C. In an embodiment, fluid connectors 113A-C are dripless blind mating connectors. For example, fluid distribution modules 103A-C can be configured to slidably fit into one or more frame slots (slots are shown with shelves 305A-C in FIG. 3) of cooling apparatus 100. When fluid distribution modules 103A-C slide in to the fitted frame slots, corresponding blind-mating connectors (further shown in FIG. 3) of fluid distribution modules 103A-C interfaces with fluid connectors 113.

Cooling liquid loop 105-107 can include connectors 115A1-A2, 115B1-B2, and 115C1-C2 that are disposed along a length of respective supply and return lines 105-107. In an embodiment, the fluid connectors 115A1-C2 are dripless blind mating connectors. Similar to connectors 113A1-C2, when fluid distribution modules 103A-C are pushed in to the fitted frame slots, corresponding blind-mating connectors of fluid distribution modules 103A-C interfaces with blind-mate fluid connectors 115A1-C2 of supply and return lines 105-107.

In one embodiment, each of fluid distribution modules 103A-C includes internal loops to circulate local coolant fluid. The internal loops can be represented by respective vapor manifolds 119A-C and fluid manifolds 121A-C. Vapor manifolds 119A-C and fluid manifolds 121A-C of fluid distribution modules 103A-C can interface with servers, e.g., receive vapor return from, and supply coolant fluid, to the servers. In one embodiment, vapor manifolds 119A-C and/or fluid manifolds 121A-C can be inclined to a predetermined angle to facilitate fluid recirculation along a length of vapor manifolds 119A-C and/or fluid manifolds 121A-C.

In one embodiment, as previously described, fluid distribution modules 103A-C include respective condensing units 117A-C that are assembled to respective vapor manifolds 119A-C and fluid manifolds 121A-C. For example, condensing unit 117A-C can be fluidly coupled to vapor manifolds 119A-C and fluid manifolds 121A-C. Condensing units 117A-C can provide cooling for single-phase and/or two-phase coolant fluids that circulates at vapor manifolds 119A-C and fluid manifolds 121A-C, where the cooling is provided by a cooling liquid from the cooling liquid loop 105-107. In one embodiment, each of condensing units 117A-C can include a cooling coil (not shown) that receives a cooling liquid from cooling liquid loop 115A-C in the cooling coils. Vapor manifold 119A-C provides single-phase and/or two-phase coolant in vapor and/or fluid phase to an external side of the cooling coils of condensing unit 117A-C. The cooling liquid can extract heat from the single-phase and/or two-phase coolant when the cooling liquid flows through the internal side of the cooling coils. The fluid, having heat extracted, is returned to fluid manifold 121A-C.

In one embodiment, fluid distribution modules 103A-C can circulate a coolant fluid in unison or different coolant fluids in isolation. For example, fluid distribution modules 103A-C can include corresponding fluid valves 123A-C and 125A-C. Fluid valves 123A-C and 125A-C can configure some or all of fluid distribution modules 103A-C to circulate a coolant fluid in unison via two phase coolant loop 109-111. As shown in FIG. 1, fluid distribution modules 103A and 103C are configured to provide a two-phase coolant fluid in unison, and module 103B is configured to provide a separate single-phase coolant that is different from the fluid of modules 103A and 103C. In this example, valves 123A, 123C and 125A, 125C are in an open position. Vapor/fluid of modules 103A, 103C can enter condensing units 117A, 117C via vapor lines 127A, 127C, or line 109 and liquefied coolant then returns to any of modules 103A, 103C via fluid lines 129A, 129C, or line 111. In this case, since both condensing units 117A, C share vapor line 109 and fluid line 111, the fluid coolant of modules 103A, C are unified (e.g., same temperature, flow rate, and cooling capacity). Note that each of modules 103A, 103C provide coolant fluid to a corresponding server chassis. Each pair of valves 123A and 125A, 123B and 125B, or 123C and 125C can be controlled by a controller, or manually configured by an operator.

Referring to FIG. 1, the coolant fluid of modules 103B is excluded from the unison. For example, valves 123B and 125B are configured in a closed position and the coolant fluid of module 103B can only enter condenser 117B via local line 127B and return via local line 129B. In this case, the coolant fluid of modules 103B can be a distinct coolant fluid different than the two-phase coolant fluid used by modules 103A, 103C. In one embodiment, the coolant fluid of modules 103B is a single-phase coolant fluid (such as mineral oil, glycol, dielectric solution, etc.). Note that module 103B provides the coolant fluid to a corresponding server chassis.

Although FIG. 1 shows modules 103A and 103C unified its two-phase coolant fluid and module 103B provides an isolated single-phase coolant fluid, different combination of fluid distribution modules can be used for different sets of servers that uses different coolant fluids. In some embodiments, the fluid distribution modules 103A-C have different form-factors so their dimensions are aligned with corresponding server chassis.

FIGS. 2A-2B are block diagrams illustrating variations of a side view of a cooling apparatus according to some embodiments. Cooling apparatuses 200-300 can represent cooling apparatus 100 of FIG. 1. As shown in FIG. 2A, cooling apparatus 200 have all modules 103A-C configured to operate in isolation. For example, valves 123A-C and 125A-C are in the closed position and fluid is localized to the individual modules 103A-C. The fluid recirculated by each of modules 103A-C can have a dedicated type of coolant fluid providing cooling to servers that is fluidly coupled to the corresponding modules 103A-C. The fluid of each modules 103A-C can be the same or different from the rest of the modules 103A-C. E.g., single-phase coolant fluid, two-phase coolant fluid, etc.

Figure 2:
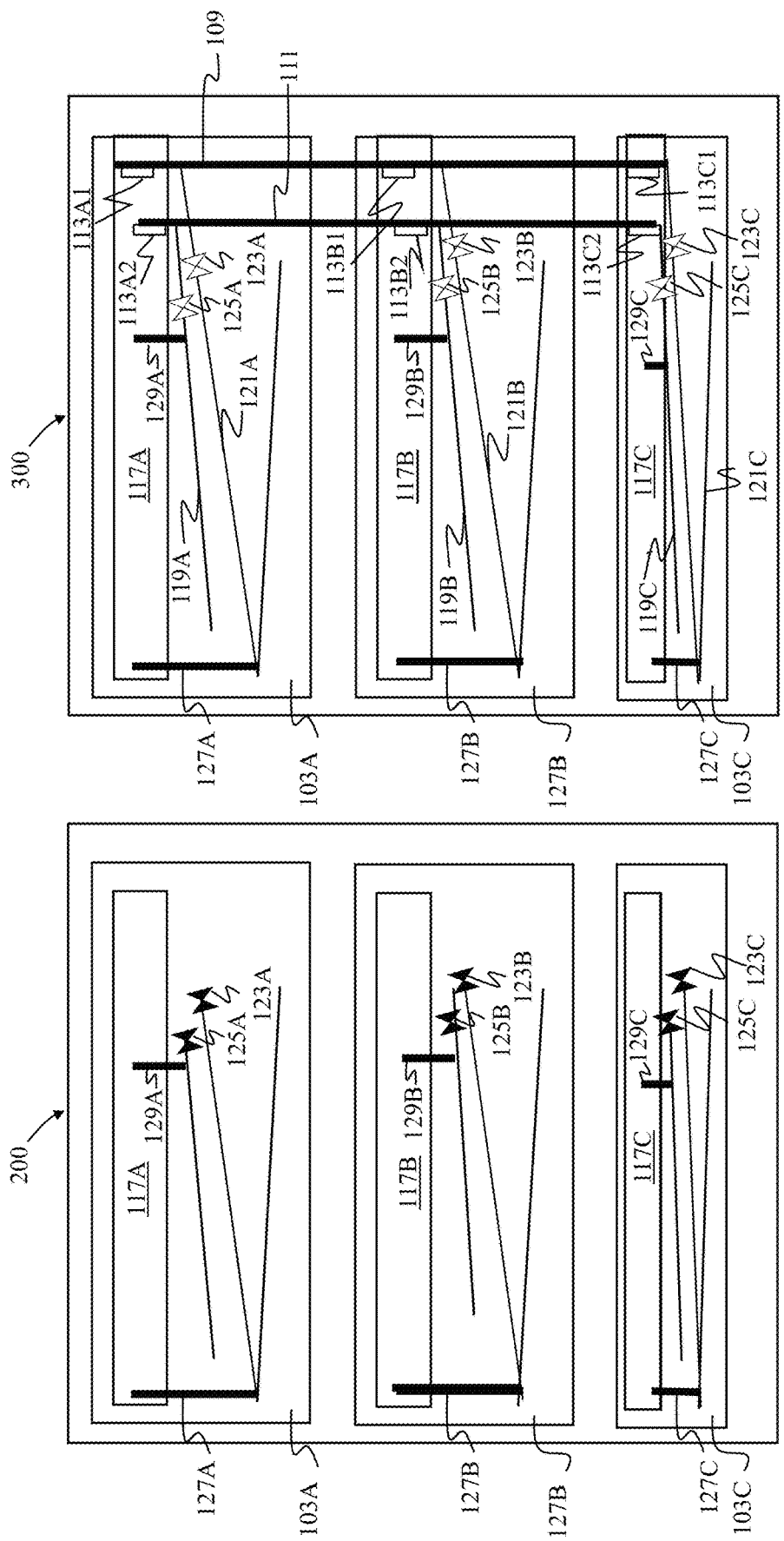
FIGS. 2A-2B are block diagrams illustrating variations of a side view of a cooling apparatus according to some embodiments.

Referring to FIG. 2B, cooling apparatus 300 have modules 103A-C configured to operate in unity. For example, valves 123A-C and 125A-C are configured in an open position. Fluids recirculated by each of modules 103A-C are of one type, e.g., two-phase coolant fluid. The fluid can be recirculated via any of vapor line 109 and fluid line 111 and/or lines 127A-C, and 129A-C. The fluid in unity can share a same temperature and cooling capacity for the servers that are cooled by the fluid. Note that additional connectors are disposed on vapor manifolds 119A-C and fluid manifolds 121A-C and are shown only in FIG. 3, but not in FIGS. 1-2 for ease of illustrations.

Figure 3:
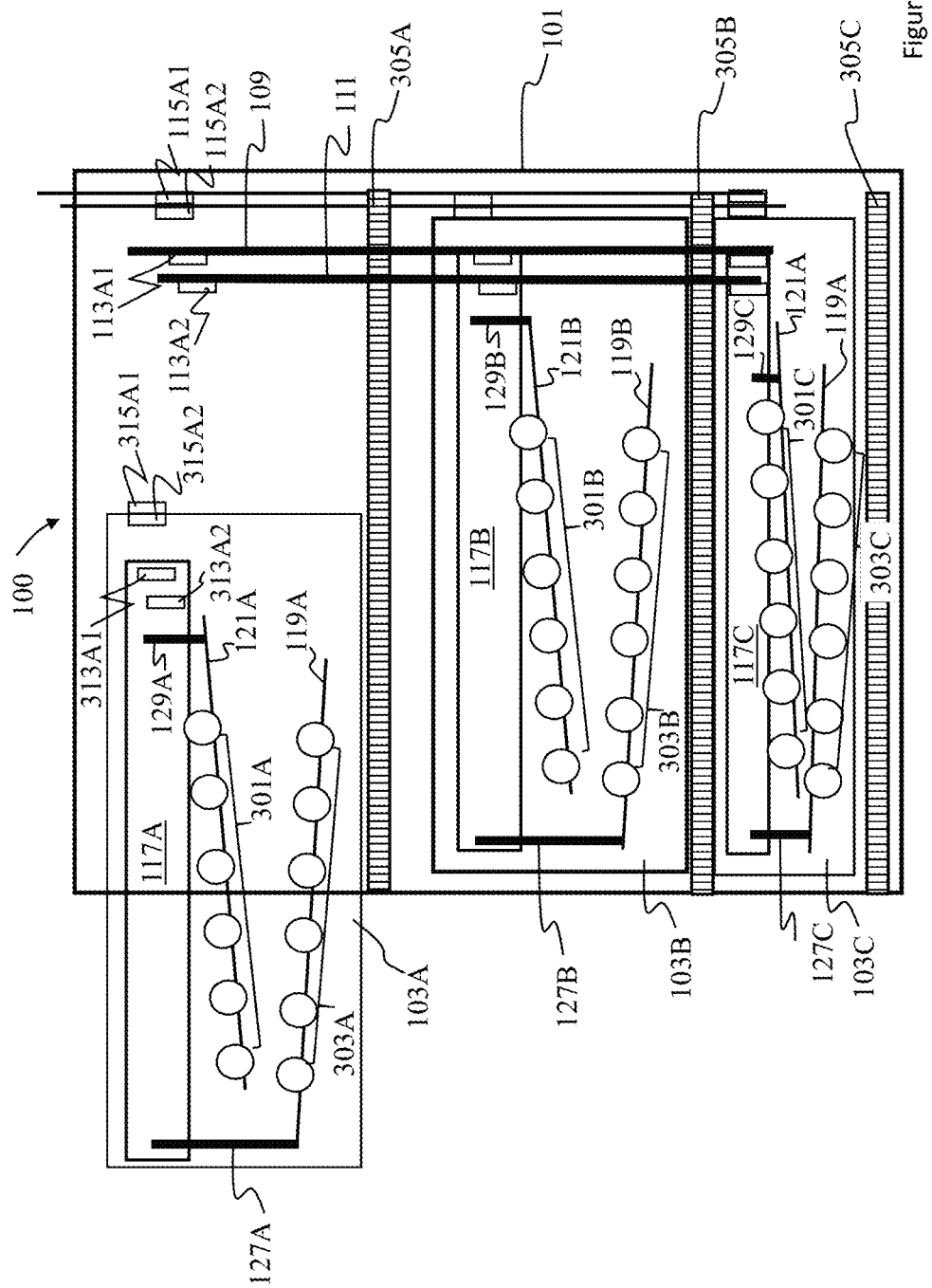
FIG. 3 is a block diagram illustrating a side view of a cooling apparatus having a plurality of fluid connections according to one embodiment.

FIG. 3 is a block diagram illustrating a side view of a cooling apparatus 100 having a plurality of fluid connections according to one embodiment. As shown, unit 100 includes fluid distribution modules 103A-C, where the integration and operation of fluid distribution modules 103A-C at a server rack are independent from one another. As shown, fluid distribution module 103A is unengaged from unit 100. Any of fluid distribution module 103A-C can be disengaged by pulling the fluid distribution module away from a fitted slot that is formed by frame 101 and shelves 305A-C. As previously described, fluid distribution modules 103A-C includes respective vapor manifolds 119A-C and fluid manifolds 121A-C. Vapor manifolds 119A-C and fluid manifolds 121A-C include a plurality of connection ports 301A-C and 303A-C along a length of the respective vapor manifolds 119A-C and fluid manifolds 121A-C. Each connection port can include a connector to interface with a connection port of a server such that the server has connections to both of the vapor and liquid manifolds. In one embodiment, vapor manifolds 119A-C are inclined at a predetermined angle (such as, −60, −50, −40, −30, −20 degrees from horizontal axis, etc.) to facilitate vapor return from any corresponding servers to vapor manifolds 119A-C via line 127A-C. In one embodiment, fluid manifolds 121A-C are inclined at a predetermined angle (such as, 60, 50, 40, 30, 20 degrees from horizontal axis, etc.) to facilitate fluid supply from fluid manifolds 121A-C to the servers via line 129A-C.

Further, any blind-mating connectors of corresponding fluid distribution modules 103A-C can be disengaged/engaged from cooling apparatus 100. For example, as shown in FIG. 1, blind-mating connectors 313A1-A2, 315A1-A2 of fluid distribution module 103A are disengaged from cooling apparatus 100. Here, blind-mating connectors 313A1-A2 are used to engage/disengage with 113A1-A2 respectively, and blind-mating connectors 315A1-A2 are used to engage/disengage with 115A1-A2 respectively, when fluid distribution module 103A slides into shelf 305A. Note that for ease of illustration, FIG. 3 shows fluid distribution modules 103A-C are configured to operate in isolation, where corresponding valves (not shown) are closed and vapor manifolds 119A-C and liquid manifolds 121A-C are not fluidly coupled to respective vapor line 109 and liquid line 111.

Figure 4:
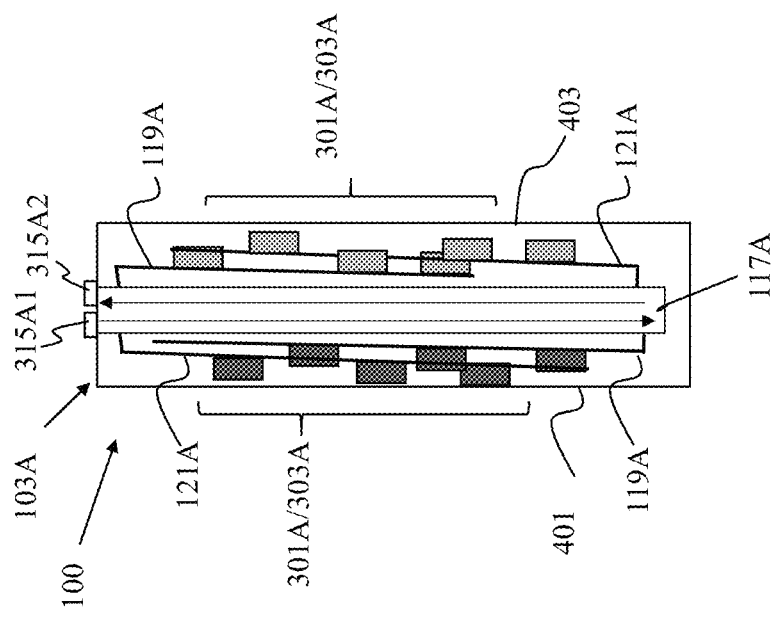
FIG. 4 is a block diagram illustrating a top view of a cooling apparatus having a plurality of fluid connections on two sides according to one embodiment.

FIG. 4 is a block diagram illustrating a top view of a cooling apparatus 100 having a plurality of fluid connections on two sides according to one embodiment. In some embodiments, any of fluid distribution modules can be designed with single sided or double sided connection packagings to the vapor/fluid manifolds. FIG. 4 shows, in one embodiment, fluid distribution module 103A is designed with double sided connection packagings to fluidly couple with the vapor/fluid manifolds. For example, fluid distribution module 103A can include connection panels 401-403 on both sides. In one embodiment, connection panels 401 includes a subset of connection ports 301A and/or 303A from either vapor manifold 119A and/or fluid manifold 121A. Connection panels 403 includes another subset of connection ports 301A and/or 303A from either vapor manifold 119A and/or fluid manifold 121A. In between connection panels 401 and 403 can be the condensing unit (or cooling core) 117A having vapor manifold 119A and fluid manifold 121A fluidly coupled thereto. Connector ports 301A and/or 303A can include corresponding blind-mating connectors for a blind-mating connection to connectors of a server chassis.

In another embodiment, connection panel 401 can correspond to connection ports 301A for the fluid manifold 121A and connection panel 403 can correspond to connection ports 303A for the vapor manifold 119A. As further described in FIG. 5, the connection panels 401-403 can interface with corresponding connection panels of server chassis, and blind-mating connectors of either connector ports 301A and/or 303A can engage with corresponding connectors of the connection panels at the server chassis.

Figure 5:
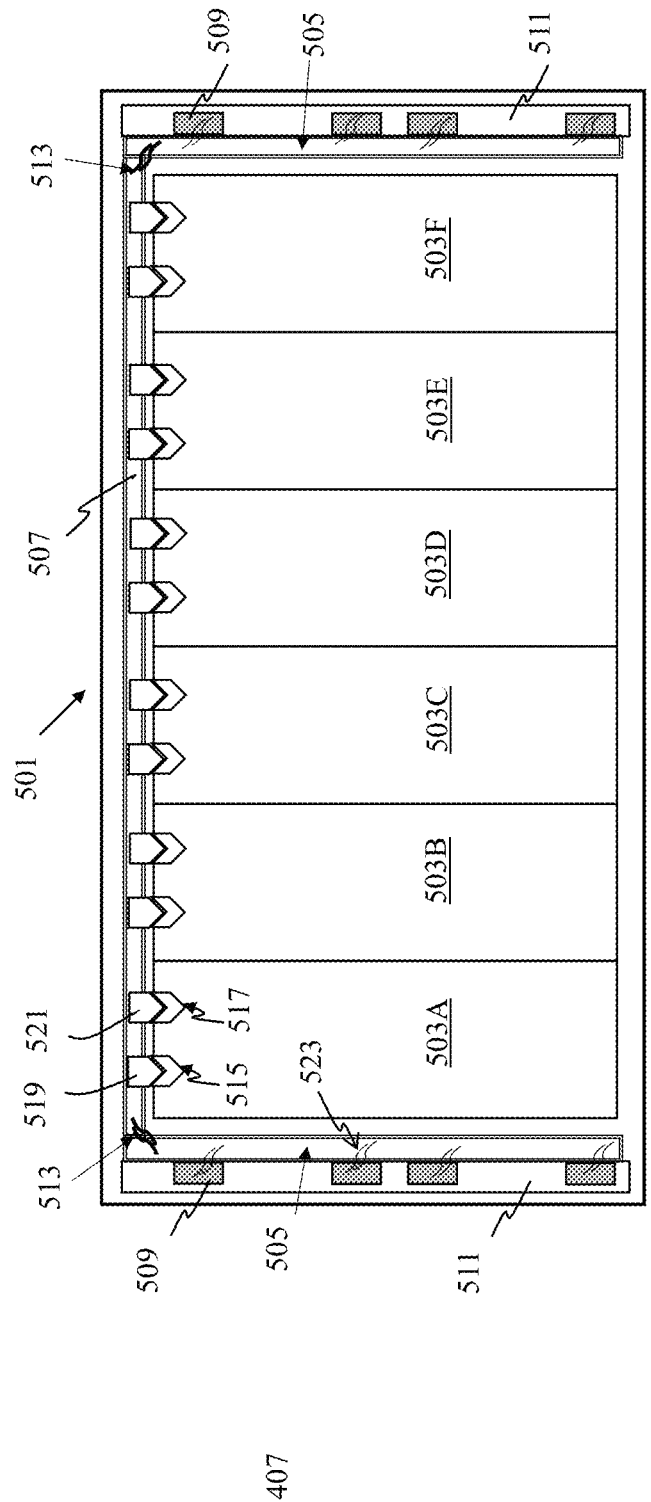
FIG. 5 is a block diagram illustrating a top view of a server chassis according to one embodiment.

FIG. 5 is a block diagram illustrating a top view of a server chassis 501 according to one embodiment. Server chassis 501 can be integrated with any one of fluid distribution modules 103A-C of unit 100. As shown, server chassis 501 includes one or more server nodes 503A-F that is fluidly cooled. In some embodiments, server chassis 501 include 6 or 12 blade server nodes 503A-F, but any other number is also possible.

In one embodiment, servers 503A-F can be part of a data center can be configured to provide information technology (IT) services. Specifically, the servers of the data center may include a host server (referred to as a host node) and/or one or more compute servers (also referred to as computing nodes, such as CPU server and GPU server). The host server (having one or more CPUs) typically interfaces with clients (not shown) over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, the servers can perform any type of computing task and/or can be any type of computing device (e.g., a server, a storage device, etc.) with various high power density components, such as memory modules, central/graphical processing units, accelerator units, etc. In one embodiment, the servers can be edge computing devices. Thus, while the servers provide the IT services, electronic components of the servers generate heat that forms hot spots on the electronic components.

Figure 8:
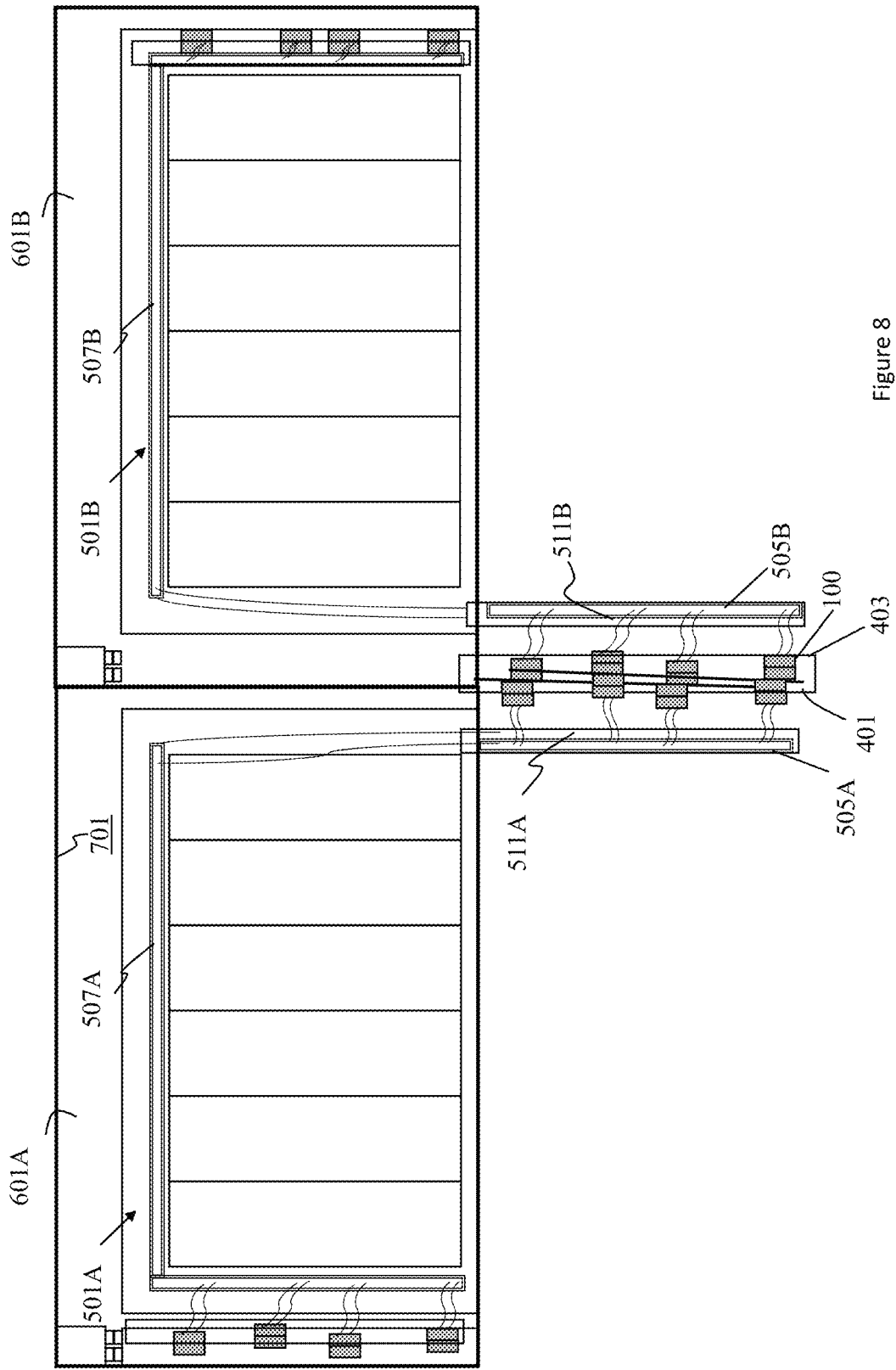
FIG. 8 is a block diagram illustrating a top view of two adjacent racks with a removable cooling apparatus according to one embodiment.

In one embodiment, chassis 501 includes chassis side modules 505 on either side of chassis 501 for fluid connections. Each of chassis side modules 505 can include a movable connection panel 511 and one or more connectors 509 that are packaged on the connection panel 511. The connectors 509 can be blind-mating connectors that interfaces with corresponding blind-mating connectors 301A-C, 303A-C disposed on panels 401-403 of cooling apparatus 100 of FIGS. 3-4. In one embodiment, the number of connectors 509 can correspond to supply/return ports of the number of servers 503A-F. In another embodiment, there are four connectors 509 (two connectors for supply line and two connectors for return line to provide redundancy in case any one of the connectors fail). In one embodiment, chassis side modules 505 can include a supply channel and a return channel, and connectors 509 of connection panel 511 includes flexible hoses 523 that are fluidly coupled to the supply and return channels. In another embodiment, each supply/return channel correspond to a respective server. E.g., six supply/return channels for the six servers 503A-F. The supply and return channels can be flexible tubings, hoses, pipes, manifolds, or any fluid channeling medium. Note that flexible hoses 523 allow connection panel 511 to displace at least a threshold distance (slide out as shown in FIG. 8) for an operator to connect the connectors 509 of panel 511 with corresponding connectors 301-303 of cooling apparatus 100 of FIGS. 3-4.

In one embodiment, chassis 501 includes a chassis rear module 507. Chassis rear module 507 can include supply channel(s) and return channel(s) similar to that of chassis side module 505, and can include fluid lines 513. Fluid lines 513 can couple the supply/return channels of chassis rear module 507 to the supply/return channels of chassis side module 505. In one embodiment, fluid lines 513 include flexible hoses and are extendable to a predetermine threshold (slide out as shown in FIG. 8). In one embodiment, chassis rear module 507 can include a plurality of blind-mating connectors 519-521 that are fluidly coupled to the supply and return channels respectively. Blind-mating connectors 519-521 can interface with corresponding blind-mating connectors 515-517 of servers 503 to supply and return fluid from servers 503. For example, when any of fluid cooled servers 503 are populated to server chassis 501, the servers 503 and their corresponding fluid enclosure slides in chassis 501 and blind-mating connectors 515-517 of corresponding server 503 interfaces with corresponding blind-mating connectors 519-521 of chassis rear module 507. Note that the blind-mating connectors allow operators to easily remove any of servers 503 for service and maintenance and eliminate the operator from having to reach behind the server and corresponding server chassis to manually interface connectors of server chassis 501 to connectors of servers 503.

FIG. 6 is a block diagram illustrating a top view of a server chassis 501 coupled to a cooling apparatus 100 according to one embodiment. As shown, server chassis 501 is populated in rack 601. A cooling apparatus 100 is assembled within rack 601 and cooling apparatus 100 interfaces with a connector panel 511 of chassis side module 505 to a left side of server chassis 501. The connector panel 511 as shown has fix connectors 509. Each of connectors 509 interfaces with corresponding connectors 301 or 303 for a server. Here, the connectors for fluid supply would be fluidly coupled to the connector of a supply channel and the connectors for vapor return would be fluidly coupled to the connector of a return channel.

In one embodiment, cooling apparatus 100 engages with a rack cooling liquid source 603 to provide a cooling liquid at ports 315A1-A2 of fluid distribution modules 301A. In another embodiment, cooling apparatus 100 engages with a rack cooling liquid source 603 and cooling liquid source 603 includes cooling liquid supply line 105 and cooling liquid return line 107 and corresponding blind-mating connectors 115A1-C2.

FIG. 7 is a block diagram illustrating a top view of two adjacent racks 601A-601B sharing one cooling apparatus 100 according to one embodiment. For example, a main frame 701 secures rack 601A to rack 601B. Cooling apparatus 100 is populated at rack 601B. In one embodiment, cooling apparatus 100 includes one or more fluid distribution modules that can include double-sided connector panels 401-403 as that shown in FIG. 4. Connector panel 401 can engage with connection panel 511A of chassis side module 505A at rack 601A. Connector panel 403 can engage with connection panel 511B of chassis side module 505B at rack 601B. Such a design allows fluid distribution and fluid connections to be populated at both sides of an electronic rack using a single cooling apparatus 100.

FIG. 8 is a block diagram illustrating a top view of two adjacent racks 601A-601B with a cooling apparatus 100 removed according to one embodiment. The configuration of FIG. 8 can represent that of FIG. 7. As shown, cooling apparatus 100 and chassis side modules 505A, 505B of racks 601A-601B are pulled out from the server racks 601A-601B for services and maintenances, where the extendable flexible hoses 513 extends chassis side modules 505A, 505B from respective chassis rear modules 507A, 507B.

Figure 9:
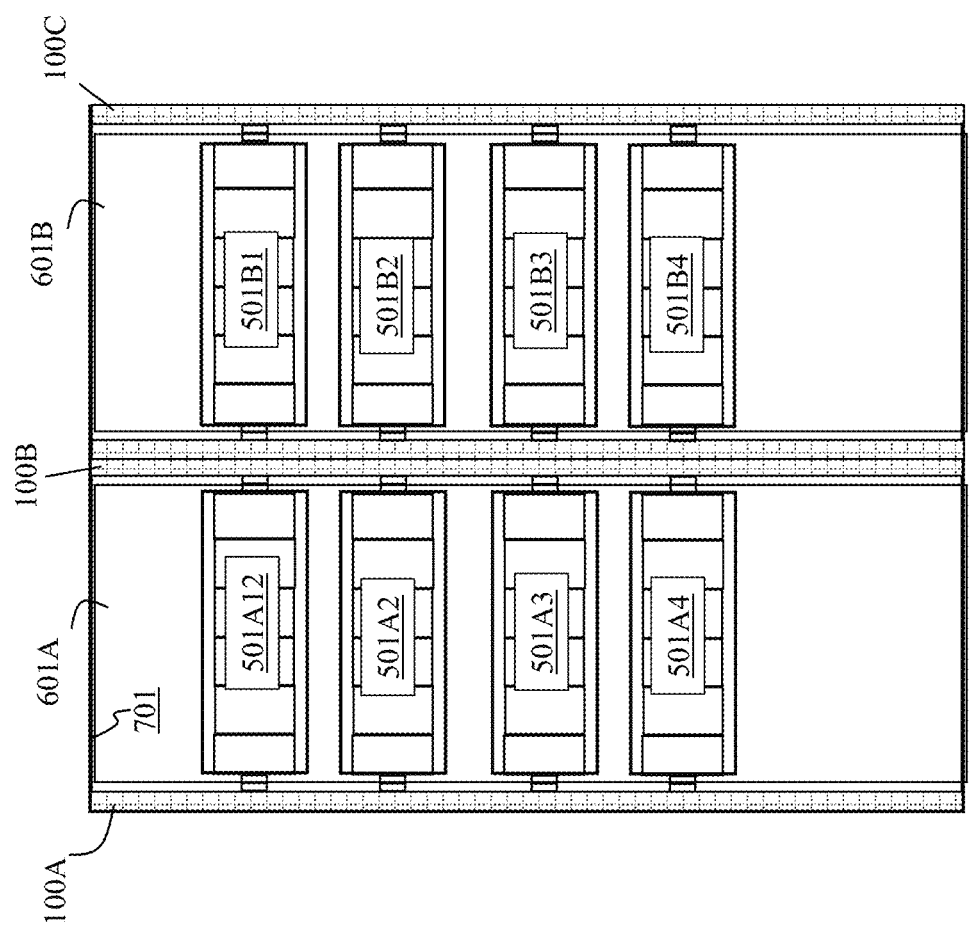
FIG. 9 is a block diagram illustrating a front view of two adjacent racks sharing a cooling apparatus having a plurality of fluid distribution modules according to one embodiment.

FIG. 9 is a block diagram illustrating a front view of two adjacent server racks 601A-601B sharing a cooling apparatus 100B having a plurality of fluid distribution modules according to one embodiment. As shown in FIG. 9, server racks 601A-601B includes main frame 701 for server chassis population. Four server chassis 501A1-A4 are populated at rack 601A and four server chassis 501B1-B4 are populated at rack 601B. Each server chassis is shown to have six blade servers. Cooling apparatuses 100A-100C are integrated with racks 601A-601B and each cooling apparatus provide fluid connectors for server chassis adjacent to the cooling apparatus. Although four server chassis 501B1-B4 are shown for a rack, and each server chassis is shown with six servers, each rack can have any number of server chassis and any server chassis can have any number of servers. A fluid distribution module of any of cooling apparatuses 100A-100C can server any adjacent server chassis. Each server chassis can be fluidly cooled by a particular coolant fluid that can be different from the other server chassis or a plurality of server chassis can be unified with a same cooling capacity by sharing a same coolant fluid.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling apparatus, comprising:
   one or more slots; and
   one or more fluid distribution modules insertable into the one or more slots, wherein each fluid distribution module comprises:
   a pair of blind mating connectors that are fluidly connected to a cooling liquid supply line and a cooling liquid return line when the fluid distribution module is inserted into one of the one or more slots;
   a condenser disposed at a top portion of the fluid distribution module;
   a vapor manifold fluidly coupled to a return port of the condenser, wherein the vapor manifold includes a plurality of return connections along a length of the vapor manifold;
   a fluid manifold fluidly coupled to a supply port of the condenser, wherein the fluid manifold includes a plurality of supply connections along a length of the fluid manifold, wherein the plurality of supply and return connections are fluidly coupled to a plurality of servers populated on an electronic rack to provide coolant fluid to the plurality of servers; and
   a two-phase fluid supply line fluidly coupled to the fluid manifold of each fluid distribution module.

2. The cooling apparatus of claim 1, further comprising a plurality of connectors disposed along the plurality of supply and return connections to interface with a plurality of supply and return connectors of a server chassis.

3. The cooling apparatus of claim 1, wherein the vapor manifold connects a return port of the condenser to the plurality of return connections at a first inclined angle to facilitate vapor return from the plurality of return connections to the condenser.

4. The cooling apparatus of claim 3, wherein the fluid manifold connects a supply port of the condenser to the plurality of supply connections at a second inclined angle to facilitate liquid supply from the condenser to the plurality of supply connections.

5. The cooling apparatus of claim 1, further comprising one or more supply valves disposed between the two-phase fluid supply line and the fluid manifold of each fluid distribution module, wherein the one or more supply valves open to allow fluid of a respective fluid distribution module to mix with that of other fluid distribution modules.

6. The cooling apparatus of claim 1, further comprising a two-phase fluid return line fluidly coupled to the vapor manifold of each fluid distribution module.

7. The cooling apparatus of claim 6, further comprising one or more return valves disposed between the two-phase fluid return line and the vapor manifold of each fluid distribution module, wherein the one or more return valves open to allow vapor of a respective fluid distribution module to mix with that of other fluid distribution modules.

8. The cooling apparatus of claim 1, further comprising two-phase fluid supply and return lines that are fluidly coupled to the condenser of each fluid distribution module via blind-mating connectors.

9. The cooling apparatus of claim 1, wherein when a supply value and a return valve corresponding to a fluid distribution module are closed, fluid of the fluid distribution module is isolated from other fluid distribution modules, wherein a first fluid distribution module contains two-phase coolant fluid and a second fluid distribution module contains single-phase coolant fluid.

10. A server rack, comprising:
 a main frame having one or more server chassis to contain a plurality of servers therein;
 a cooling apparatus secured to the main frame, the cooling apparatus comprising:
  one or more slots;
  one or more fluid distribution modules insertable into the one or more slots to correspond to the one or more server chassis, each fluid distribution module comprises:
   a pair of blind mating connectors that are fluidly coupled to a cooling liquid supply line and a cooling liquid return line when the fluid distribution module is inserted into one of the slots,
   a condenser disposed at a top portion of the fluid distribution module,
   a vapor manifold fluidly coupled to a return port of the condenser, wherein the vapor manifold includes a plurality of return connections along a length of the vapor manifold, and
   a fluid manifold fluidly coupled to a supply port of the condenser, wherein the fluid manifold includes a plurality of supply connections along a length of the fluid manifold, wherein the plurality of supply and return connections are fluidly coupled the servers to provide coolant fluid to the servers; and
  a two-phase fluid supply line fluidly coupled to the fluid manifold of each fluid distribution module.

11. The server rack of claim 10, wherein the cooling apparatus further comprises a plurality of connectors disposed at the plurality of supply and return connections to interface with a plurality of supply and return connectors of a server chassis.

12. The server rack of claim 11, wherein each server chassis comprises:
 a detachable connection panel having the plurality of connectors disposed on the detachable connection panel;
 a chassis side module having at least a fluid supply channel and a fluid return channel; and
 a plurality of flexible hoses fluidly coupling the plurality of connectors disposed on the connection panel to either the supply or return channels of the chassis side module.

13. The server rack of claim 12, wherein each server chassis further comprises a chassis rear module having at least a fluid supply channel and a fluid return channel, a pair of flexible hoses fluidly coupling the supply and return channels of the chassis side module to the supply and return channels of the chassis rear module.

14. The server rack of claim 13, wherein the chassis rear module comprises a plurality of blind-mating connectors connected to corresponding blind-mating connectors of the servers.

15. The server rack of claim 10, wherein the vapor manifold connects a return port of the condenser to the plurality of return connections at a first inclined angle to facilitate vapor return from the plurality of return connections to the condenser.

16. The server rack of claim 10, wherein the fluid manifold connects a supply port of the condenser to the plurality of supply connections at a second inclined angle to facilitate liquid supply from the condenser to the plurality of supply connections.

17. The server rack of claim 10, wherein the cooling apparatus further comprises one or more supply valves disposed between the two-phase fluid supply line and the fluid manifold of each fluid distribution module, wherein the one or more supply valves open to allow fluid of a respective fluid distribution module to mix with that of other fluid distribution modules.

18. The server rack of claim 10, wherein the cooling apparatus further comprises a two-phase fluid return line fluidly coupled to the vapor manifold of each fluid distribution module.

* * * * *